United States Patent
Chang et al.

(10) Patent No.: US 9,709,601 B2
(45) Date of Patent: Jul. 18, 2017

(54) CONDUCTED TYPE CURRENT PROBE

(71) Applicant: National Applied Research Laboratories, Hsinchu (TW)

(72) Inventors: Yin-Cheng Chang, Hsinchu (TW); Da-Chiang Chang, Hsinchu (TW)

(73) Assignee: NATIONAL APPLIED RESEARCH LABORATORIES, Hsinchu (TW)

(*) Notice: Subject to any disclaimer, the term of this patent is extended or adjusted under 35 U.S.C. 154(b) by 171 days.

(21) Appl. No.: 14/264,503

(22) Filed: Apr. 29, 2014

(65) Prior Publication Data

US 2015/0268272 A1    Sep. 24, 2015

(30) Foreign Application Priority Data

Mar. 18, 2014  (TW) .............................. 103110184 A

(51) Int. Cl.
*G01R 1/06* (2006.01)
*G01R 1/067* (2006.01)
*G01R 1/20* (2006.01)

(52) U.S. Cl.
CPC .......... *G01R 1/06766* (2013.01); *G01R 1/203* (2013.01)

(58) Field of Classification Search
CPC ............. G01R 1/067; G01R 1/20; G01R 1/02
USPC .... 324/446, 754.01, 754.03, 754.26, 755.01, 324/696, 715, 724, 72.5, 149
See application file for complete search history.

(56) References Cited

U.S. PATENT DOCUMENTS

| | | | | |
|---|---|---|---|---|
| 5,627,476 A * | 5/1997 | Chambers | ............... | G01R 27/16 324/649 |
| 5,966,787 A * | 10/1999 | Nakayama | ............. | B82Y 35/00 29/25.35 |
| 6,621,146 B1 * | 9/2003 | Bowman | ........... | H01L 21/82341 257/327 |
| 7,015,709 B2 * | 3/2006 | Capps | ................ | G01R 1/06788 324/149 |
| 7,667,567 B2 * | 2/2010 | Saracco | ................. | G01R 15/04 324/601 |
| 7,966,588 B1 * | 6/2011 | Perry | ................... | G06F 17/5036 707/E17.107 |
| 2003/0072549 A1 * | 4/2003 | Facer | ..................... | C12N 13/00 385/129 |
| 2004/0201391 A1 * | 10/2004 | Miller | ................ | G01R 1/07378 324/756.03 |
| 2005/0237073 A1 * | 10/2005 | Miller | ................ | G01R 1/07385 324/756.03 |
| 2006/0176074 A1 * | 8/2006 | Van Epps | .......... | G01R 1/06766 326/30 |
| 2007/0296439 A1 * | 12/2007 | Feustel | ................... | H01L 22/34 324/754.03 |
| 2008/0001611 A1 * | 1/2008 | Convers | ............. | G01R 1/06766 324/754.07 |

(Continued)

*Primary Examiner* — Jermele M Hollington
*Assistant Examiner* — Alvaro Fortich
(74) *Attorney, Agent, or Firm* — Huffman Law Group, PC

(57) ABSTRACT

A conducted type current probe is provided herein and comprises a plurality of first resistors, at least one second resistor, a first connective port, and a second connective port. The first resistors are connected in parallel to form a resistor with 1Ω resistance value, and the resistance value of the second resistor is 49Ω. The first resistors and the second resistor are connected. The first connective port is connected with a test end of a test Integrated Circuit (IC), and the second connective port is connected with a test receiver by a coaxial cable.

6 Claims, 10 Drawing Sheets

(56) References Cited

U.S. PATENT DOCUMENTS

| | | | |
|---|---|---|---|
| 2008/0164897 A1* | 7/2008 | Seo | G01R 31/31715 |
| | | | 324/750.01 |
| 2008/0218187 A1* | 9/2008 | Lesher | G01R 35/005 |
| | | | 324/754.09 |
| 2011/0042672 A1* | 2/2011 | Makita | H01P 3/003 |
| | | | 257/51 |
| 2011/0178748 A1* | 7/2011 | Shlepnev | G06F 17/5036 |
| | | | 702/65 |
| 2014/0169987 A1* | 6/2014 | Du | F04B 1/146 |
| | | | 417/53 |

\* cited by examiner

| Frequency range | DC-1GHz |
|---|---|
| Measurement resistor | 1Ω(1%) |
| Matching resistor | 49Ω(1%) |
| Maximum current | <5A |
| Output impedance Zo | 40Ω-60Ω |
| Insertion loss in calibration circuit | 34dB±2dB |
| Decoupling | Larger than the limit line |

FIG. 7A

CONDUCTED TYPE CURRENT PROBE

CROSS REFERENCE TO RELATED APPLICATION

This application claims priority to Taiwan Application Serial Number 103110184, filed on Mar. 18, 2014, which are herein incorporated by reference.

FIELD OF THE DISCLOSURE

The present invention relates to the field of a conducted type current probe, and more particularly relates to a conducted type current probe able to reduce test error caused by the parasitic inductance of the current probe when implementing the current probe to do the test.

BACKGROUND OF THE DISCLOSURE

Since the continuous miniaturization of the feature size in integrated circuit (IC) technology and the scaling down of the size of the devices, as well as the increasing amount of transistors, allows IC to be operated at high speeds with low power consumption and the significance of the electromagnetic compatibility (EMC) of IC is increased. The high performances desired of the IC not only produce noise, but also make the IC itself sensitive to interference. This situation leads the need for characterizing their behaviors of emission and immunity. To investigate these problems, several measurement methods have been developed as the standards.

According to the transfer types of electromagnetic waves, the test methods can be further classified into radiated or conducted methods. A concise method to characterize the conducted emission of IC is known as the 1Ω/150Ω direct coupling method. The direct coupling method guarantees an IC electromagnetic emission (EME) measurement with high repeatability and correlation. Since EME is caused by fast changes of currents/voltages inside the IC, the resulted radio frequency (RF) currents/voltages distribute and form emitting loop antennas via on-chip passive distribution networks (PDN). In order to analyze the RF currents/voltages, two acquisitions named 1Ω current measurement and 150Ω voltage measurement are specified herein. Probes composed of few lump components are used to make the observation on EME behavior of a certain IC pin easier.

All RF currents form at least one loop which flows out and back to the IC. The return paths are mostly via the ground or the power plane. Therefore, the ground pin of IC is a great position for measuring the RF return current. FIG. 1 is a circuit view illustrating a conventional test system. As is shown, a 1Ω probe 102 is inserted between the ground pin 106 of the IC 104 and the ground 108 to measure the RF voltage across the 1Ω resistor of the probe. The RF voltage from all of the RF currents returning to the 1Ω is measured by a test receiver 110. As shown in FIG. 2, the 1Ω probe 20 is composed of a 1Ω resistor 202 and a 49Ω resistor 204. One end of the 1Ω resistor 202 is linked to the ground pin of the IC and the other end is connected to ground. The 49Ω resistor 204 is placed between the ground pin of the IC and the test receiver with 50Ω input impedance. As a result, this configuration achieves 50Ω (49Ω plus about 1Ω) impedance matching, which satisfies maximum power transmission when viewed from test receiver side. From the ground pin side, the 1Ω probe provides a low impedance current path for IC operation.

Due to the miniaturization trend in electronic devices, surface mounted devices (SMDs) have become the best candidate to realize a printed circuit board (PCB) level design. The leadless property reduces unwanted parasitic effect more than an axial leaded device for high frequency or high speed applications, but the parasitic effect never disappears. A typical high frequency model of an SMD resistor is shown in FIG. 3. The resistor 302 represents the intrinsic resistor and the inductance 304 forms by the finite length of the resistor and contacting pads, while the capacitance is the coupling of the pads. These parasitic values could be measured or provided by the manufacturers. Unfortunately, unlike the inductors and capacitors which are used frequently in RF and microwave applications, most resistor data sheets do not provide detailed models or frequency responses of these parasitic components. Sometimes only limited information, such as low band results, can be obtained, or some other insufficient results were released for estimation. Especially for a low value resistor, the inductance dramatically dominates the impedance out of the low frequency band. Therefore, the estimation of choosing components relies on basic network analysis. By measuring the S-parameters of the resistor, the real part and imaginary part can be distinguished. Then user can choose the appropriate component from different vendors to implement into the design.

Accordingly, a need has arisen to design the circuit of the 1Ω probe, which can eliminate the effect of the parasitic inductor of the equivalent circuit without relying on the resistor information provided by the suppliers.

SUMMARY OF THE DISCLOSURE

One objective of the present invention is to design a current probe without wasting too much cost to improve the test error caused by the parasitic impedance of the equivalent circuit of the 1Ω resistor in the conventional current probe.

According to the objective given above, a conducted type current probe is provided in the present invention and comprises a plurality of first resistors, at least one second resistor, a first connective port, and a second connective port. The first resistors are connected in parallel to form a resistor with 1Ω resistance value. The second resistor includes 49Ω resistance value, and the first resistors are connected with the second resistor. The first connective port is connected with a test point of a test integrated circuit (IC). The second connective port is connected with a test receiver by a coaxial cable.

Another objective of the present invention is to provide a current probe to minimize unwanted parasitic effect in high frequencies and enhance the power capability of the current probe.

According to the objective given above, a conducted type current probe is provided in the present invention and comprises a plurality of first resistors, at least one second resistor, a first connective port, and a second connective port.

The first resistors are connected in parallel to form a resistor with 1Ω resistance value, and the first resistors are divided into two groups respectively disposed at two sides of a group plane of the current probe. The second resistor includes 49Ω resistance value, and is connected with the first resistor. The first connective port is connected with a test point of a test integrated circuit (IC). The second connective port is connected with a test receiver by a coaxial cable. The first resistors are connected in parallel to reduce the parasitic inductance of an equivalent circuit of the first resistors and enhance the power capability of the current probe.

DESCRIPTION OF THE DRAWINGS

FIG. 7A is a specification table of the current probe in the present invention;

DETAILED DESCRIPTION OF THE PREFERRED EMBODIMENTS

The above-mentioned description of the present invention can be best understood by referring to the following detailed description of the preferred embodiments and the accompanying drawings.

Figure 1:
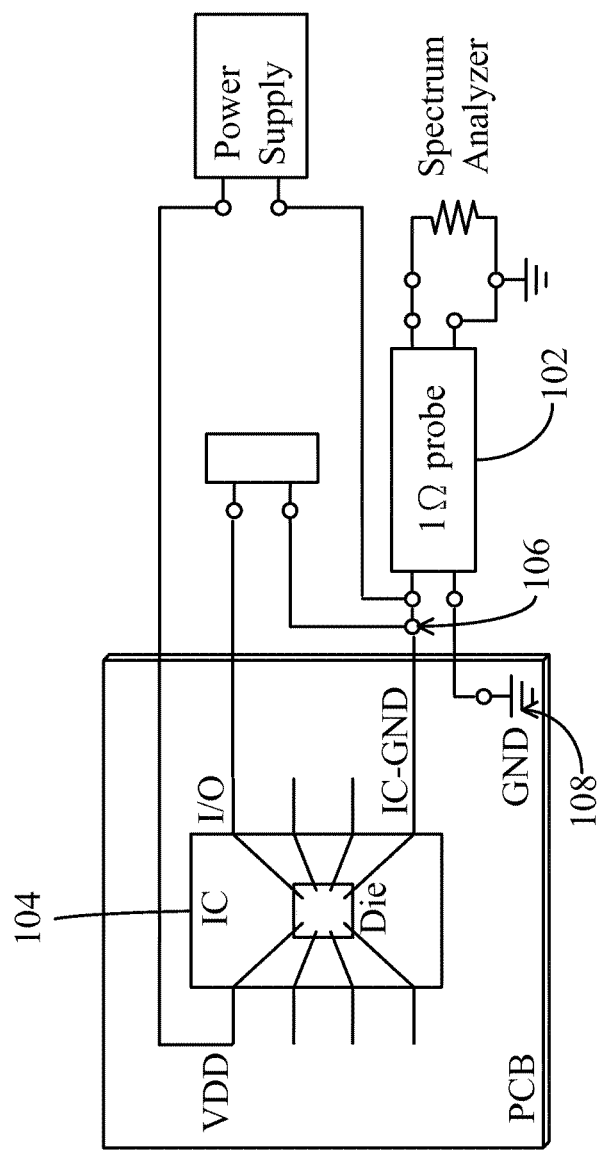
FIG. 1 is a circuit view of a conventional test system.
Figure 2:
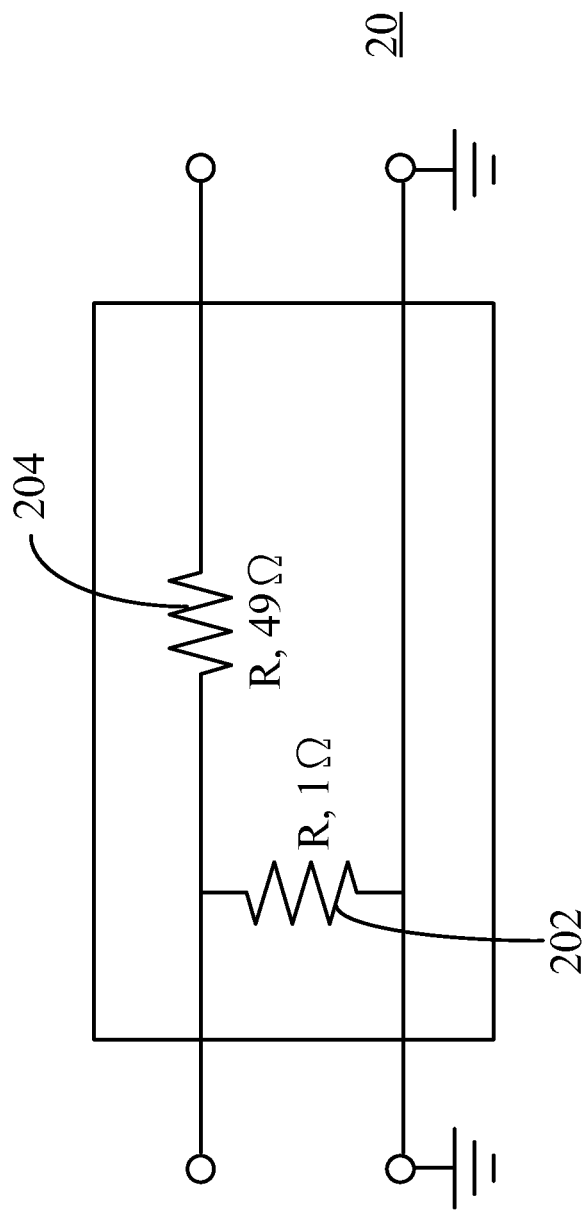
FIG. 2 is a circuit view of a conventional current probe.
Figure 3:
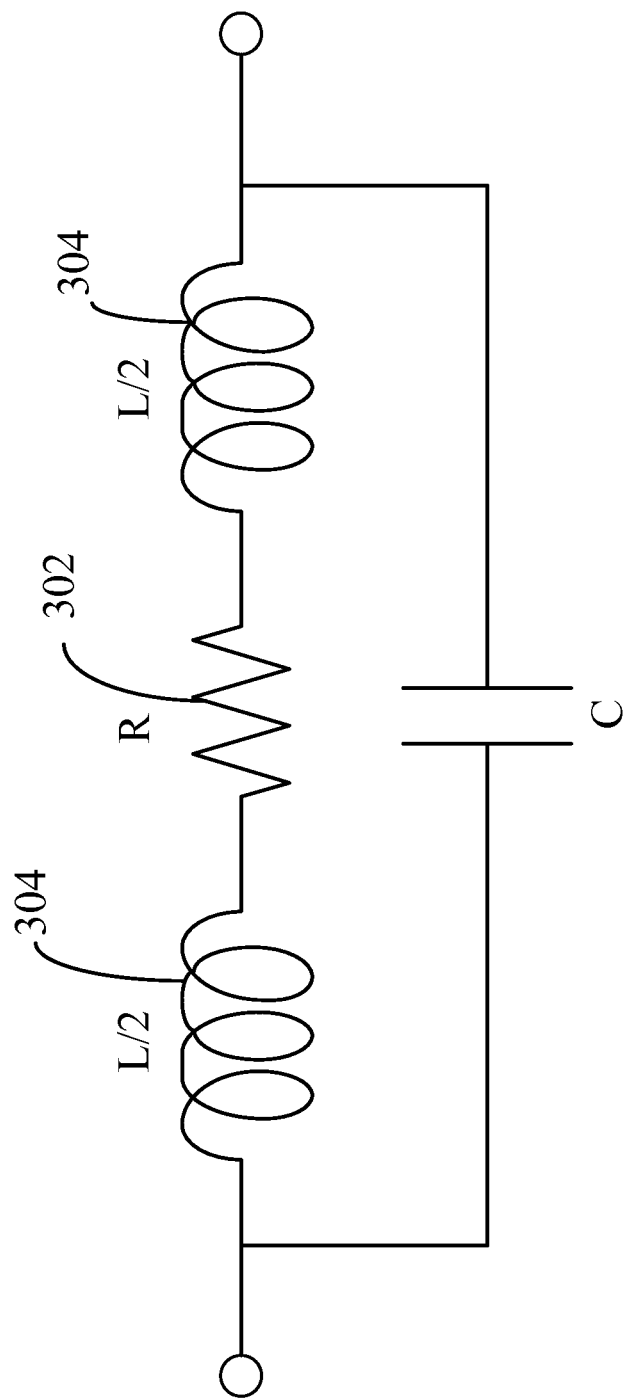
FIG. 3 is a high frequency equivalent circuit view of a resistor in the conventional current probe.
Figure 4:
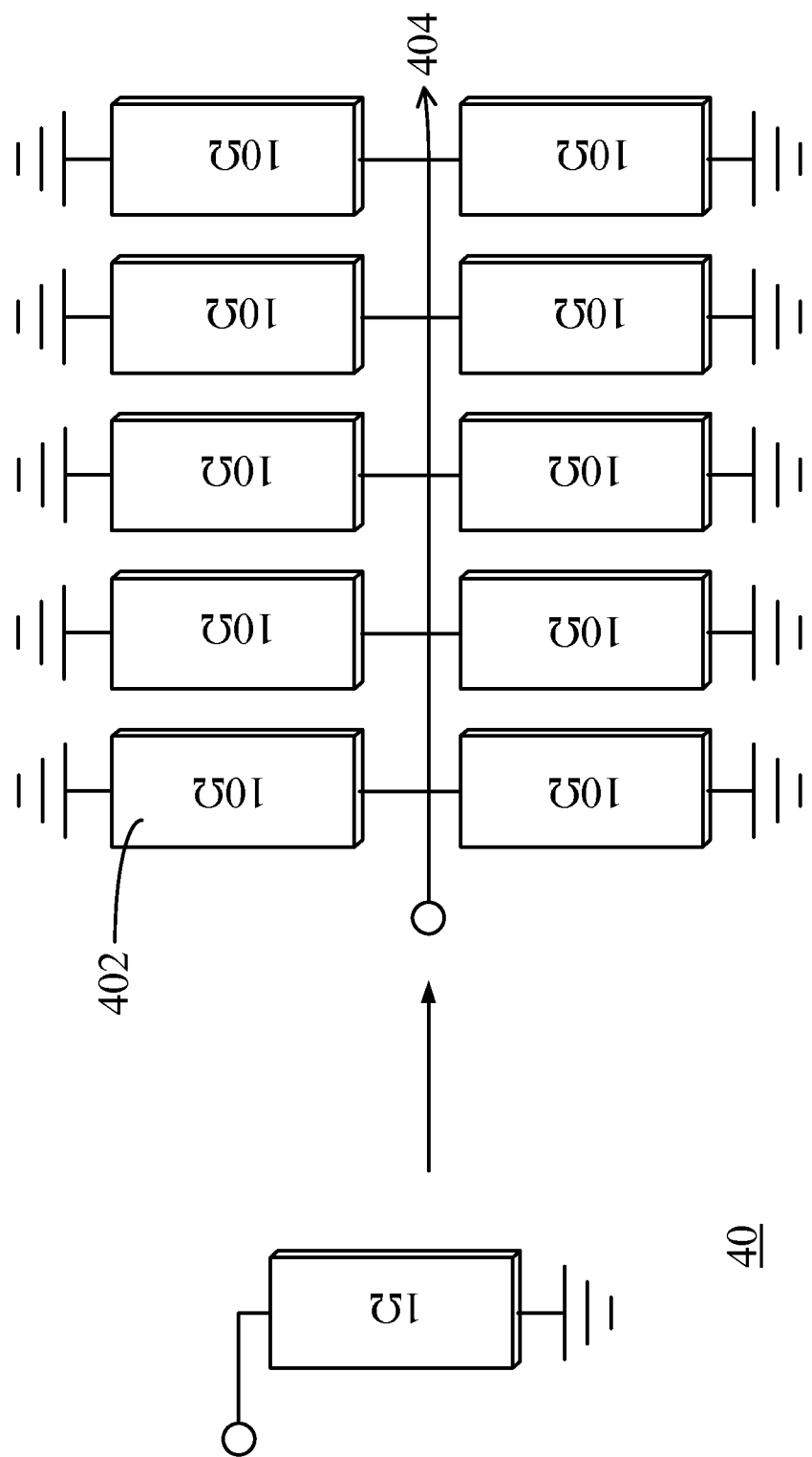
FIG. 4 is a view of a 1Ω resistor of a current probe in one embodiment of the present invention.

FIG. 4 is a view of a 1Ω resistor of a current probe in one embodiment of the present invention. In the present invention, in accordance with the properties of the shunt component, the entire resistance of the 1Ω resistor 40 is divided into multiple single components. As shown in FIG. 4, when the transmission line is a coplanar-waveguide (CPW) transmission line and the CPW transmission line includes two ground planes, ten resistors 402 with 10Ω resistance value can be divided into two groups. Accordingly, five resistors 402 with 10Ω resistance value are in one group and installed at one side of the ground plane 404 to reduce size. In addition, theoretically, another advantage of the shunt connection is to enhance the power rating N (N is an integer) times better than the single one 1Ω resistor. The aforementioned structure can achieve the specification of the 1Ω current probe. Except for component shunting, the layout and location of the current probe in the present invention is different from the conventional matter. In the current probe of the present invention, a coplanar-waveguide (CPW) transmission line is implemented to maintain the specific impedance with 50Ω and eliminate unwanted parasitic effect at high frequencies. The ground planes of the CPW structure are disposed at two sides of the signal path so as to make shunt connection easier. In addition, with regards to the CPW transmission line, conventionally the current return path of the micro-waveguide transmission line is from the substrate to the backside ground, which increases the parasitic impedance, but the design in the present invention shortens the return path. However, it should be noted that even though there are ten 10Ω resistors 402 connected in parallel to form one 1Ω resistor 40 in the present invention, it not be limited that only ten 10Ω resistors may be used and connected in parallel to be the 1Ω resistor 40.

Figure 5:
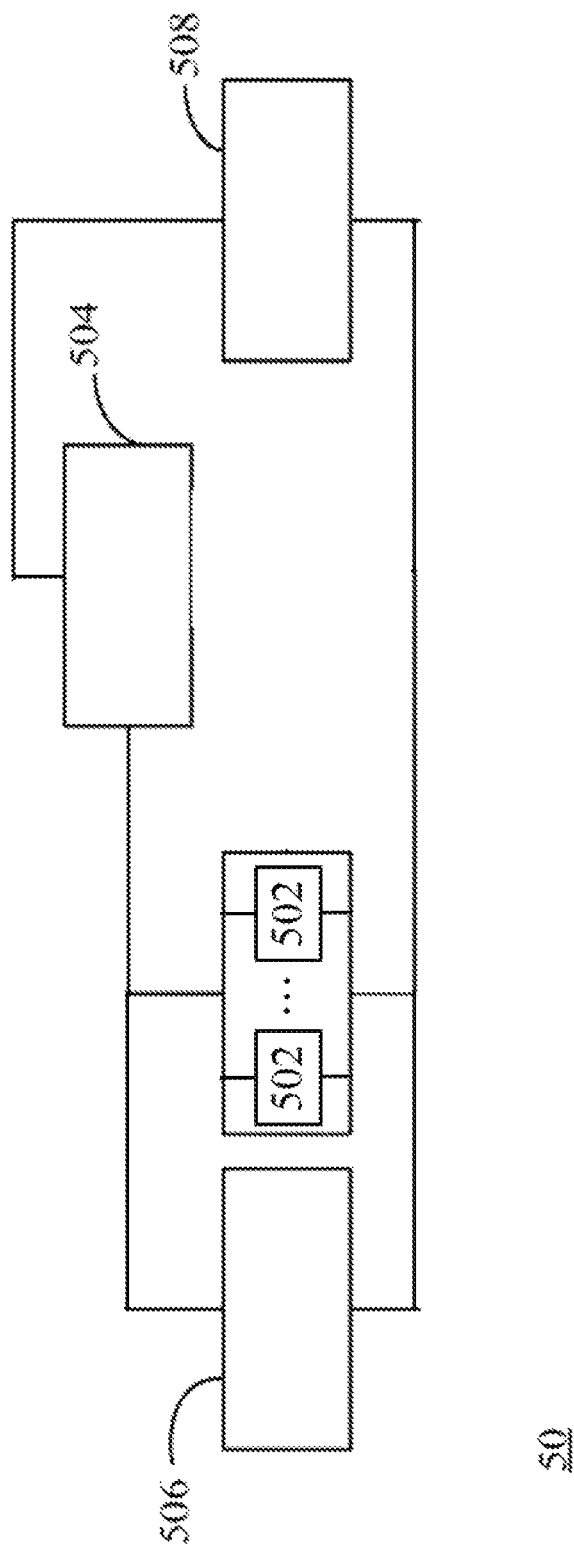
FIG. 5 is a block diagram of the current probe in the present invention.

FIG. 5 is a block diagram of the current probe in the present invention. As shown in FIG. 5, the current probe 50 includes a plurality of first resistors 502, at least one second resistor 504, a first connective port 506, and a second connective port 508. The first resistors 502 are connected in parallel to form the resistor with 1Ω resistance value, and the resistance value of the second resistor 504 is 49Ω. In the present invention, the second resistor 504 is made by one resistor with the resistance value 49Ω, but the second resistor 504 can be made by more than one resistor with a total resistance value of 49Ω, and it is not limited herein. The first resistor 502 and the second resistor 504 are connected to form a resistor with a resistance value 50Ω. The first connection port 506 is connected with a test point of an integrated circuit (IC), and the first connection port 506 is preferred to be a Small A Type connection port electrically connected with the test IC. However, in a different embodiment, the first connection port 506 can be a coaxial port, and it is not limited herein. The second connection port 508 is connected with a test receiver by a coaxial cable. The 1Ω current probe 50 is made by a Surface Mount Device (SMD) process and a Print Circuit Board (PCB), and is not expensive. After the test is done, the current probe 50 is removed and can be reused.

Figure 6:
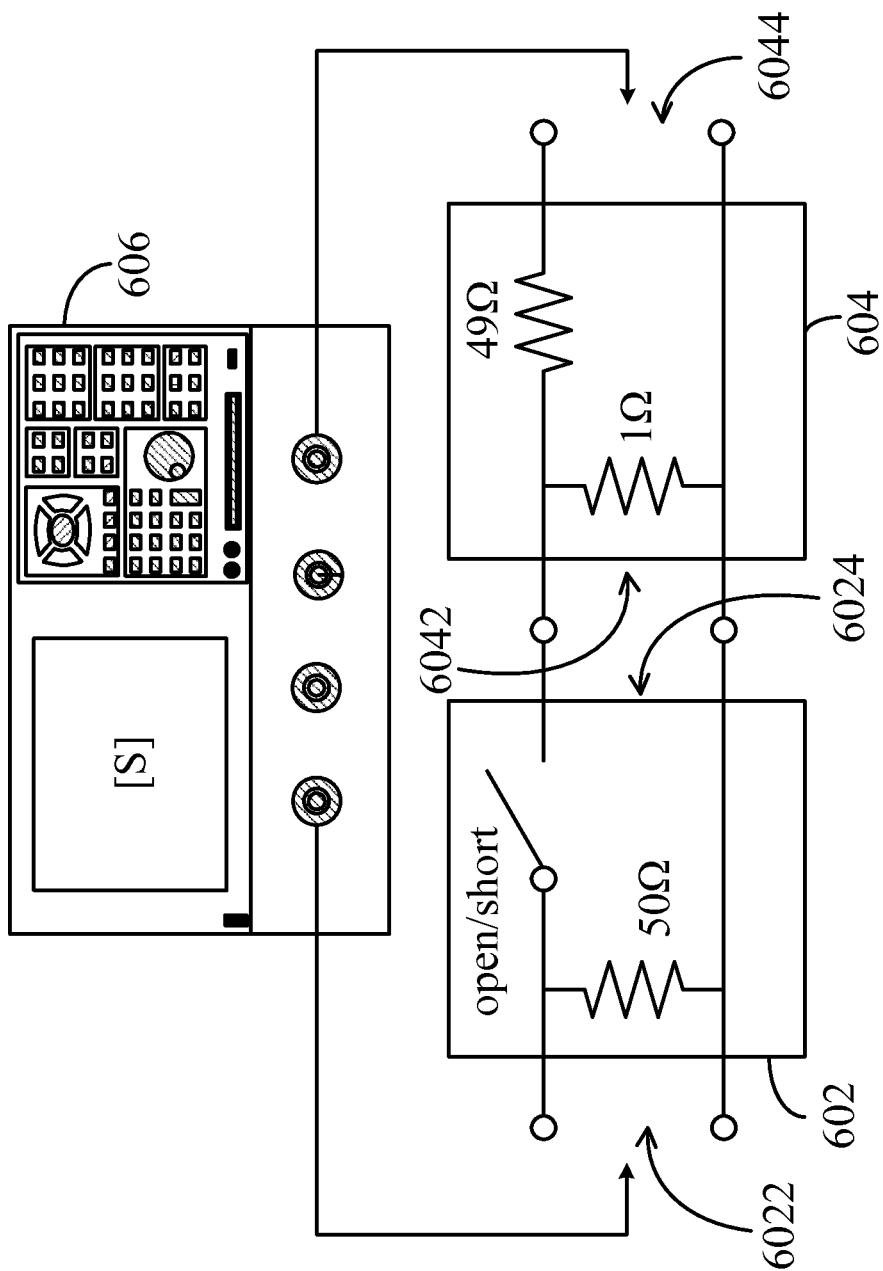
FIG. 6 is a view of the connection of the calibration board and the 1Ω current probe in the present invention.

FIG. 6 is a view of the connection of the calibration board and the 1Ω current probe in the present invention. An input port 6022 of the calibration board 602 is connected with the signal source, and the calibration board 602 is an independent board, which is implemented when performing the insertion loss of the current probe 604. The input port 6042 of the current probe 604 is connected with the output port 6024 of the calibration board 602, and the output port 6044 of the current probe 604 is connected with the test receiver 606. As shown in FIG. 6, the test receiver 606 (such as vector network analyzer and so on) is to execute the test. In accordance with whether the clamp on the calibration board 602 is in a short or an open status, two measurements will be performed. The insertion lost measured when the clamp is in a short status is considered the sensitivity of the probe. It is desired that the sensitivity of the probe exhibit a flat frequency response over the test bandwidth of 1 GHz. A variation of ±2 dB from −34 dB is allowable in the given specification. According to the current probe 604 in the present invention, the 1Ω resistor is made of multiple resistors being connected in parallel to reduce test error caused by the parasitic inductance of the equivalent circuit of the 1Ω resistor and enhance the power capability of the current probe 604 for the 1Ω resistor.

Figure 7B:
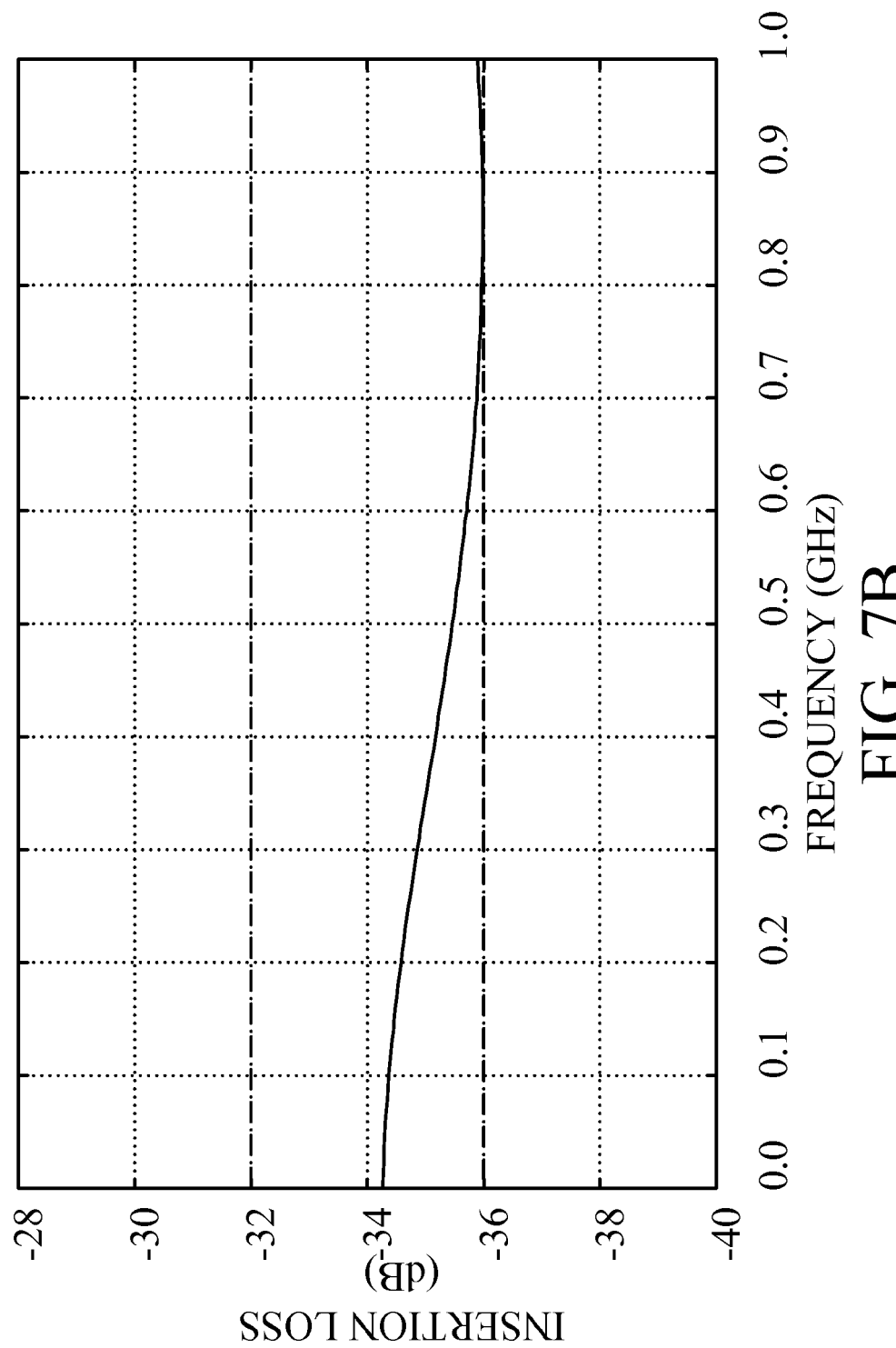
FIG. 7B is a frequency response view of the insertion loss with calibration circuit of the current probe in the present invention.
Figure 7C:
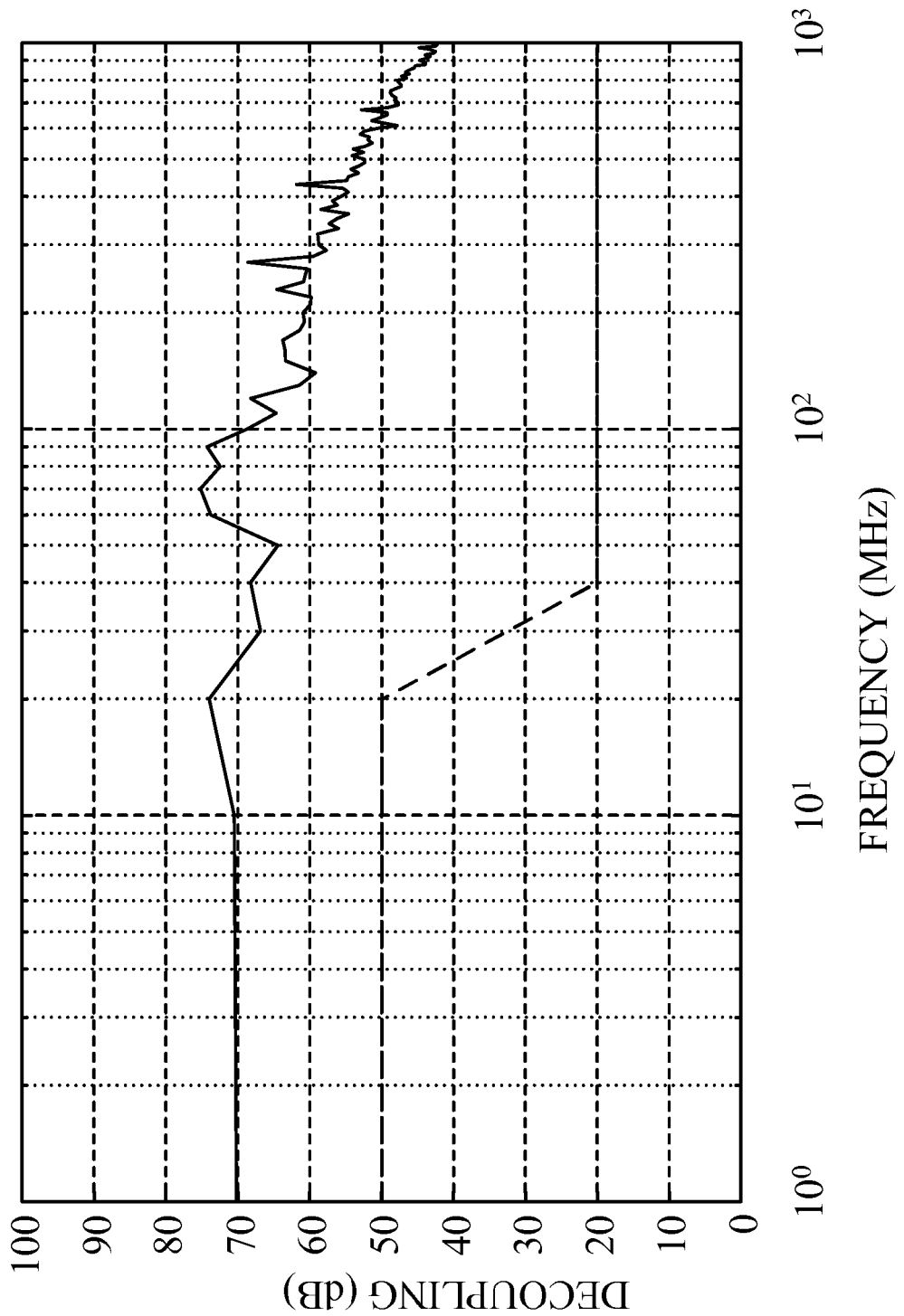
FIG. 7C is a frequency response view of the decoupling of the current probe in the present invention.
Figure 7D:
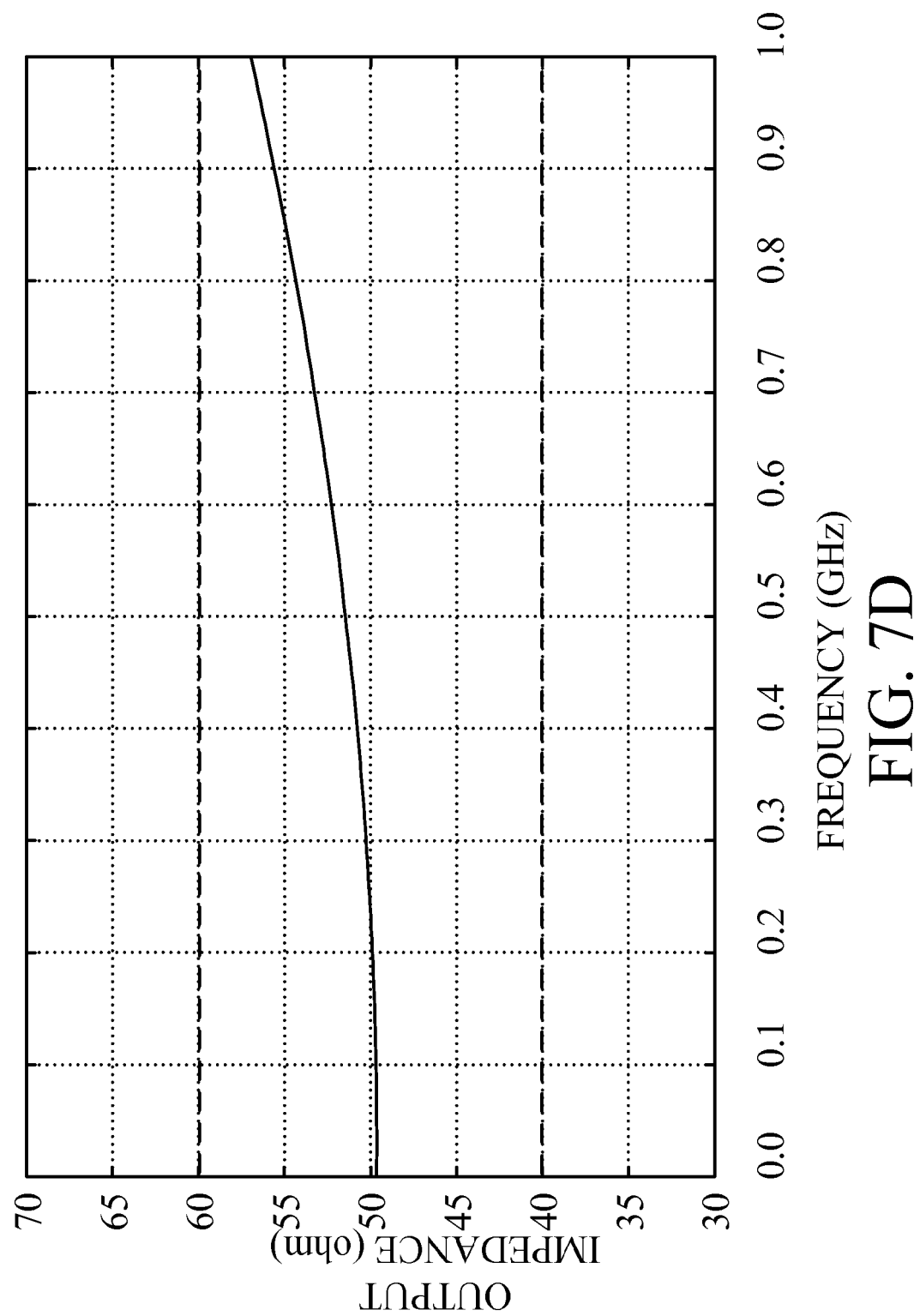
FIG. 7D is a frequency response view of the output impedance of the current probe in the present invention.

FIG. 7A is a specification table of the current probe in the present invention. As shown in FIG. 7A, the current probe in the present invention is tested and verified in all of the sections in the specification table of the present invention to prove that the current probe is satisfactory to be used in the direct coupling method so as to make the current probe certifiable. Another insertion loss measurement is performed when the clamp is in a close status. The test result of the insertion loss of the current probe is shown in FIG. 7B. By subtracting the data of the insertion loss in an open status from the sensitivity measured previously, the difference is called decoupling. This correlates the quality characteristic to the signal source, and also represents the shielding of the current probe. The decoupling performance in the present invention is shown in FIG. 7C with a limit curve versus frequency reported in the standard. The measured decoupling should be larger than the limit curve. The output impedance of the current probe is also one of the items checked. The test result of the output impedance of the current probe of the present invention is shown in FIG. 7D, which illustrates that the output impedance of the current probe of the present invention is close to 50Ω in the test receiving port to maintain the matching condition for receiving disturbance. The result shows that the output impedance complies with limited range from 40Ω to 60Ω within 1 GHz.

The present invention has been described above with preferred embodiments thereof, and it is understood that many changes and modifications to the described embodiments can be carried out without departing from the scope and the spirit of the disclosure that is intended to be limited only by the appended claims.

What is claimed is:

1. A conducted type current probe, comprising:
a plurality of first resistors connected in parallel to form a resistor with 1Ω resistance value;
at least one second resistor including 49Ω resistance value and connected in series with the first resistors to reduce parasitic impedance in an equivalent circuit of the first resistors and enhance the power capability of the current probe;
a first connective port connected with a test point of a test integrated circuit (IC); and
a second connective port connected with a test receiver by a coaxial cable;
wherein the first resistors and the second resistor are electrically connected by a coplanar-waveguide (CPW) transmission line, and the conduced type current probe is implemented in a 1Ω/150Ω direct coupling method to analyze an RF currents/voltages.

2. The conducted type current probe according to claim 1, wherein the first connective port is electrically connected with the test IC.

3. A conducted type current probe, comprising:
a plurality of first resistors connected in parallel to form a resistor with 1Ω resistance value, and the first resistors are divided into two groups respectively disposed at two sides of a group plane of the current probe;
at least one second resistor including 49Ω resistance value and connected in series with the first resistors;
a first connective port connected with a test point of a test integrated circuit (IC); and
a second connective port connected with a test receiver by a coaxial cable;
wherein the first resistors are connected in parallel to reduce parasitic inductance of an equivalent circuit of the first resistors and enhance the power capability of the current probe;
the first resistors and the second resistor are electrically connected by a coplanar-waveguide (CPW) transmission line, and the conduced type current probe is implemented in a 1Ω/150Ω direct coupling method to analyze an RF currents/voltage.

4. The conducted type current probe according to claim 3, wherein the first resistors are electrically connected with the test IC.

5. The conducted type current probe according to claim 3, wherein the first resistors and the second resistor are electrically connected by a coplanar-waveguide (CPW) transmission line.

6. The conducted type current probe according to claim 3, wherein the current probe is made by Surface Mount Device (SMD) and Print Circuit Board (PCB).

* * * * *